(12) United States Patent
Yoda et al.

(10) Patent No.: US 8,960,861 B2
(45) Date of Patent: Feb. 24, 2015

(54) LIQUID DROPLET EJECTING HEAD, PRINTING APPARATUS AND METHOD OF MANUFACTURING LIQUID DROPLET EJECTING HEAD

(71) Applicant: Seiko Epson Corporation, Tokyo (JP)

(72) Inventors: Tsuyoshi Yoda, Matsumoto (JP); Ikuya Miyazawa, Sakata (JP); Hiroshi Sugita, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/035,558

(22) Filed: Sep. 24, 2013

(65) Prior Publication Data

US 2014/0085383 A1    Mar. 27, 2014

(30) Foreign Application Priority Data

Sep. 27, 2012   (JP) .................................. 2012-213715

(51) Int. Cl.
| | | |
|---|---|---|
| *B41J 2/14* | (2006.01) | |
| *B41J 2/16* | (2006.01) | |
| *B41J 2/045* | (2006.01) | |
| *H01L 49/00* | (2006.01) | |

(52) U.S. Cl.
CPC . *B41J 2/14* (2013.01); *H01L 49/00* (2013.01); *B41J 2/14233* (2013.01); *B41J 2/161* (2013.01); *B41J 2/1623* (2013.01); *B41J 2/1629* (2013.01); *B41J 2/1631* (2013.01); *B41J 2002/14241* (2013.01); *B41J 2002/14491* (2013.01)
USPC ............................................... 347/50; 347/68

(58) Field of Classification Search
CPC .... B41J 2/14233; B41J 2/14201; B41J 2/161; B41J 2/1623; B41J 2002/14491; B41J 2/14072; B41J 2/14
See application file for complete search history.

(56) References Cited

U.S. PATENT DOCUMENTS

| | | | | |
|---|---|---|---|---|
| 7,407,270 | B2 * | 8/2008 | Furuhata | ......................... 347/58 |
| 2006/0164468 | A1 | 7/2006 | Yoda | |
| 2006/0234534 | A1 | 10/2006 | Sato | |
| 2007/0042613 | A1 | 2/2007 | Yoda | |

FOREIGN PATENT DOCUMENTS

| | | |
|---|---|---|
| EP | 1493568 | 1/2005 |
| JP | 2006-281763 | 10/2006 |
| JP | 2006-289943 | 10/2006 |
| JP | 2007-136711 | 6/2007 |
| JP | 2011-136462 | 7/2011 |

OTHER PUBLICATIONS

European Search Report for European Patent Application No. 13185915.9 dated Jan. 23, 2014.

* cited by examiner

*Primary Examiner* — Lisa M Solomon
(74) *Attorney, Agent, or Firm* — Workman Nydegger

(57) ABSTRACT

A liquid droplet ejecting head includes: a base substrate that has a concave portion that is formed to be open toward an upper surface and a wiring pattern; and an IC package that is electrically connected to the wiring pattern. The concave portion has a bottom portion and a pair of first side wall portions which stand obliquely on the bottom portion so as to be opposed to each other. Further, the wiring pattern has a plurality of linear objects, each of which is continuous and is constituted of a first part, a second part, and a third part. In addition, the IC package is formed in a chip shape, has a plurality of terminals which are formed on a front side surface, and is disposed such that the front side surface faces the concave portion, and each terminal is electrically connected to the first part.

20 Claims, 11 Drawing Sheets

LIQUID DROPLET EJECTING HEAD, PRINTING APPARATUS AND METHOD OF MANUFACTURING LIQUID DROPLET EJECTING HEAD The entire disclosure of Japanese Patent Application No: 2012-213715, filed Sep. 27, 2012 is expressly incorporated by reference herein in its entirety.

BACKGROUND

1. Technical Field

The present invention relates to a liquid droplet ejecting head, a printing apparatus, and a method of manufacturing the liquid droplet ejecting head.

2. Related Art

For example, to perform printing on a printing medium such as a printing paper, a printing apparatus, which has a liquid droplet ejecting head, is used (for example, refer to JP-A-2006-289943).

JP-A-2006-289943 discloses a liquid droplet ejecting head including: a cavity that temporarily stores an ink; and a base substrate that has an ejection port. The ejection port communicates with the cavity so as to eject the ink within the cavity as liquid droplets. Further, a piezoelectric element is disposed to be adjacent to the cavity. The piezoelectric element is electrically connected to a driver IC through a wiring pattern. The driver IC controls driving of the piezoelectric element. Then, by driving the piezoelectric element, it is possible to reliably eject ink droplets from the ejection port.

Further, in the liquid droplet ejecting head disclosed in JP-A-2006-289943, the concave portion is formed to be open toward the upper surface of the base substrate. In addition, the driver ICs are respectively disposed on both sides of the concave portion interposed therebetween (hereinafter, the disposition is referred to as "known disposition").

Meanwhile, recently, there has been a demand for a decrease in size of the liquid droplet ejecting head. Hence, it is also necessary to decrease the size of the base substrate. However, when the size of the base substrate is decreased, in the known disposition, it may be difficult to arrange the driver ICs on the base substrate. When the driver ICs are intended to be arranged, while a space for disposition of the driver ICs is secured, the space may be made to be as small as possible. Even in this case, there is a problem in that it is difficult to sufficiently decrease the size of the liquid droplet ejecting head.

SUMMARY

An advantage of some aspects of the invention is to provide a liquid droplet ejecting head capable of achieving a decrease in size, a printing apparatus having the liquid droplet ejecting head, and a method of manufacturing the liquid droplet ejecting head.

An aspect of the invention is directed to a liquid droplet ejecting head including: a base substrate of a plate-like body that has a concave portion that is formed to be open toward one surface and a wiring pattern made of a conductive material; and an IC package that is electrically connected to the wiring pattern, in which the concave portion has a bottom portion and two side wall portions, which stand on the bottom portion so as to be opposed to each other, and the two side wall portions are inclined such that a separation distance between the two side wall portions gradually increases toward the one surface side, in which the wiring pattern has a plurality of linear objects, each of which is continuous and is constituted of a first part formed on the one surface, a second part formed on the side wall portion, and a third part formed on the bottom portion, and in which the IC package is formed in a chip shape, has a plurality of terminals which are formed on a surface opposed to the concave portion, and each terminal is electrically connected to the first part.

With this configuration, it is possible to minimize the space for disposition of the IC package on the base substrate. Therefore, it is possible to reliably decrease the size of the liquid droplet ejecting head. Further, for example, when a plurality of piezoelectric elements for ejecting the liquid droplets can be controlled with a single IC package, the configuration is further advantageous in decreasing the size of the liquid droplet ejecting head.

In the liquid droplet ejecting head of the aspect of the invention, it is preferable that the linear objects are arranged to be distributed on both sides of the two side wall portions.

With this configuration, the multiple (plural) linear objects constituting the wiring pattern can be reliably arranged. Consequently, the IC package, which is capable of transmitting and receiving a large volume of information through the linear objects, can be mounted on the base substrate.

In the liquid droplet ejecting head of the aspect of the invention, it is preferable that the concave portion is formed in a shape of a channel, and the two side wall portions are opposed to each other in a direction of intersecting with the channel.

With this configuration, the multiple (plural) linear objects constituting the wiring pattern can be reliably arranged. Consequently, the IC package, which is capable of transmitting and receiving a large volume of information through the linear objects, can be mounted on the base substrate.

In the liquid droplet ejecting head of the aspect of the invention, it is preferable that the linear objects are disposed with spacings interposed therebetween along a direction of the channel.

With this configuration, the linear objects, which are adjacent in the length direction of the channel, are more reliably prevented from being shorted (short-circuited) to each other.

In the liquid droplet ejecting head of the aspect of the invention, it is preferable that the linear object spacings neighboring to one another increase from the one surface side toward the bottom portion side.

With this configuration, the linear objects, which are adjacent in the length direction of the channel, are more reliably prevented from being shorted (short-circuited) to each other.

In the liquid droplet ejecting head of the aspect of the invention, it is preferable that a length of the IC package in a direction of the channel is shorter than a total length of the channel.

With this configuration, the inside of the concave portion is made to communicate with the outside. With such a configuration, for example, it is possible to dissipate the heat of the inside of the concave portion. Thus, heat generated from the IC package and the wiring is prevented from being trapped in the concave portion.

In the liquid droplet ejecting head of the aspect of the invention, it is preferable that a plurality of the IC packages are disposed with spacings interposed therebetween in a direction of the channel.

With this configuration, it is possible to dissipate the heat of the inside of the concave portion (channel) from the spacings between the IC packages.

In the liquid droplet ejecting head of the aspect of the invention, it is preferable that a connection member containing a conductive material is disposed between each terminal and each first part, each terminal is electrically connected to each first part through the connection member, and the connection member has a function of fixing the IC package onto the base substrate.

With this configuration, it is not necessary to separately provide a fixing member for fixing the IC package onto the base substrate. Thus, the liquid droplet ejecting head can be formed to have a simple structure. As a result, the liquid droplet ejecting head is made to have a small size.

In the liquid droplet ejecting head of the aspect of the invention, it is preferable that the base substrate has an ejection port, which is formed to be open toward the other surface of the plate-like body and ejects liquid droplets, and a piezoelectric element which causes the liquid droplets to be ejected from the ejection port, and the IC package is electrically connected to the piezoelectric element through the wiring pattern so as to control an operation of the piezoelectric element.

With this configuration, for example, it is possible to precisely and reliably control the ejection conditions such as an amount of ejected liquid droplets and ejection timing (ejection and stop of the ejection).

In the liquid droplet ejecting head of the aspect of the invention, it is preferable that the base substrate has a first plate-like body that has the concave portion, and a second plate-like body that is bonded to an opposite side to a side, on which the concave portion of the first plate-like body is open, and that has the piezoelectric element, and the first plate-like body and the second plate-like body are bonded through an adhesive.

With this configuration, the first plate-like body and the second plate-like body can be respectively employed in accordance with use applications and functions. Accordingly, it is possible to obtain a low-profile (small-sized) liquid droplet ejecting head. When the liquid droplet ejecting head is provided in a printing apparatus, this contributes to a decrease in size of the printing apparatus.

In the liquid droplet ejecting head of the aspect of the invention, it is preferable that the wiring pattern is formed of a plurality of layers which are laminated.

With this configuration, the layers constituting the wiring pattern can be respectively employed in accordance with use applications and functions. Thus, this configuration is advantageous in decreasing the size of the liquid droplet ejecting head.

Another aspect of the invention is directed to a printing apparatus including the liquid droplet ejecting head according to the above-mentioned aspect of the invention.

With this configuration, it is possible to provide the printing apparatus having the small-sized liquid droplet ejecting head.

Still another aspect of the invention is directed to a method of manufacturing the liquid droplet ejecting head, in which the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, in which the method includes: a step of bonding the first plate-like body and the second plate-like body; a step of forming a wiring pattern by forming the first part on the one surface, forming the second part on the side wall portion, and forming the third part on the bottom portion; and a step of mounting the IC package such that the front side surface of the IC package faces the concave portion and each terminal is electrically connected to each first part.

With this configuration, it is possible to reliably manufacture the liquid droplet ejecting head capable of achieving a decrease in size. Thus, for example, by mounting the liquid droplet ejecting head in the printing apparatus, it is possible to provide a small-sized printing apparatus.

Yet another aspect of the invention is directed to a method of manufacturing the liquid droplet ejecting head, in which the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, and in which the method includes: forming a first wiring pattern by forming the first part on the one surface and forming the second part on the side wall portion; bonding the first plate-like body and the second plate-like body; forming a second wiring pattern by forming the third part on the bottom portion; and mounting the IC package such that the front side surface of the IC package faces the concave portion and each terminal is electrically connected to each first part.

With this configuration, it is possible to reliably manufacture the liquid droplet ejecting head capable of achieving a decrease in size. Thus, for example, by mounting the liquid droplet ejecting head in the printing apparatus, it is possible to provide a small-sized printing apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a liquid droplet ejecting head, a printing apparatus, and a method of manufacturing the liquid droplet ejecting head will be described in detail, on the basis of preferred embodiments of the invention, with reference to the accompanying drawings.

First Embodiment

Figure 1:
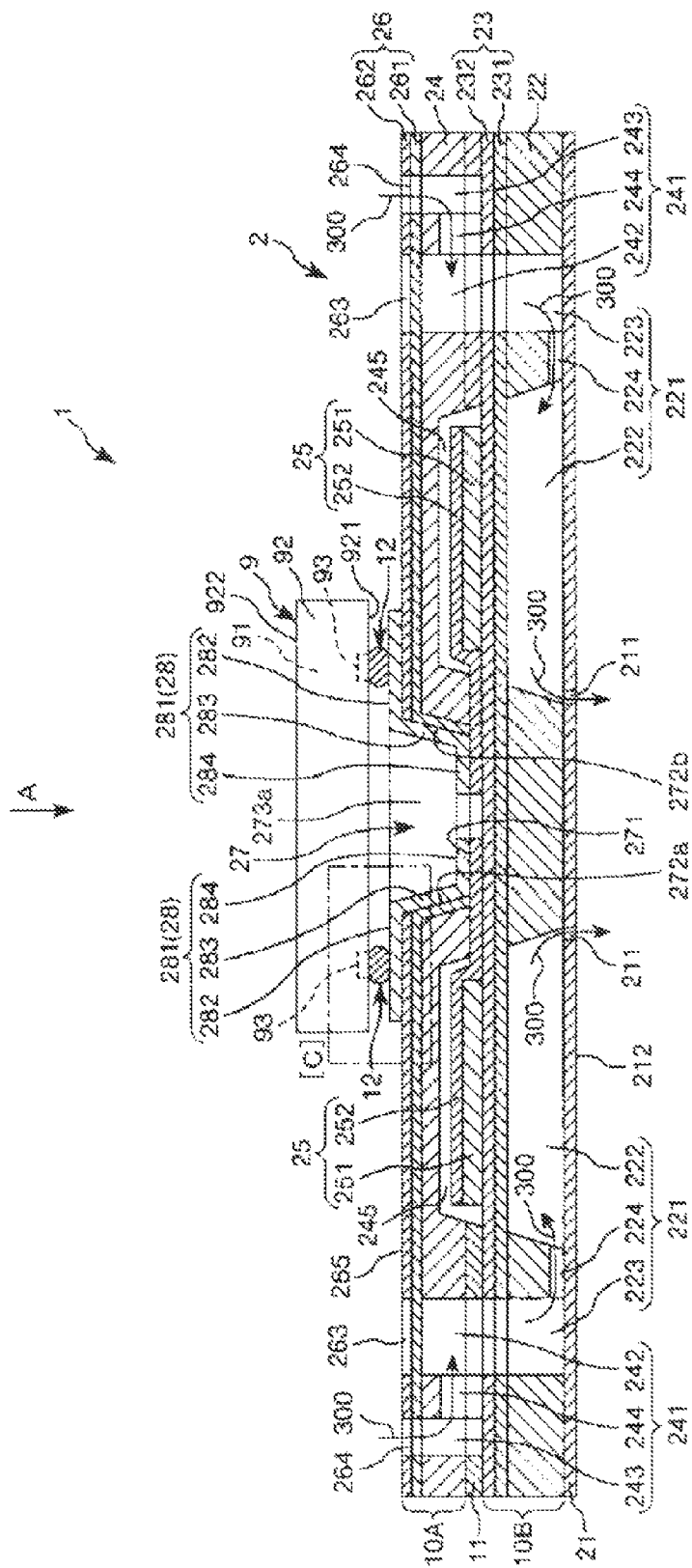
FIG. 1 is a transverse cross-sectional view illustrating a liquid droplet ejecting head according to an embodiment of the invention.
Figure 2:
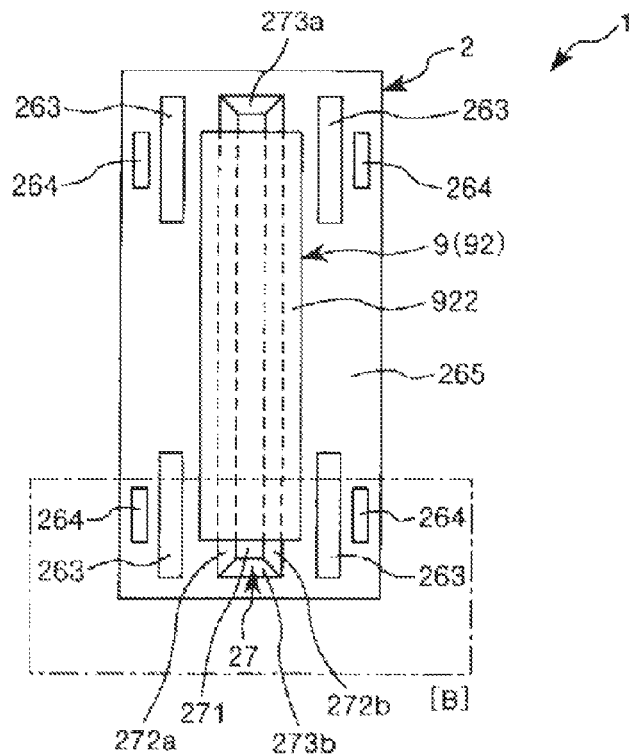
FIG. 2 is a diagram (top plan view) viewed from a direction of the arrow A of FIG. 1.
Figure 3:
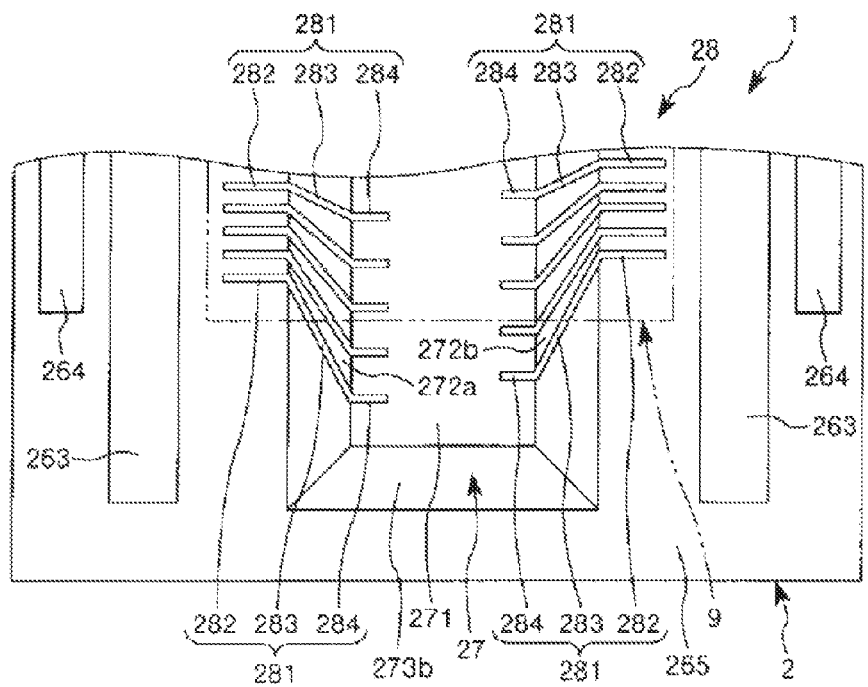
FIG. 3 is an enlarged detailed diagram of a region [B] surrounded by the chain line of FIG. 2.
Figure 4:
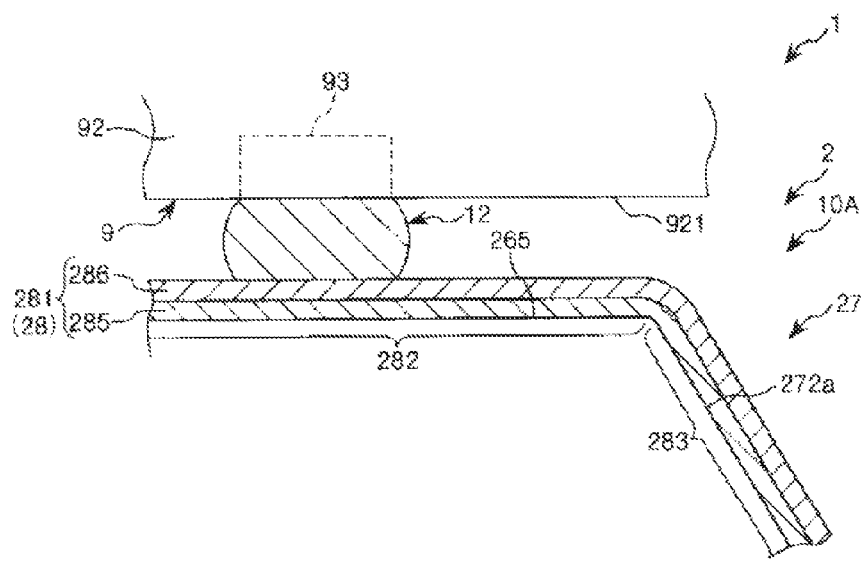
FIG. 4 is an enlarged detailed diagram of a region [C] surrounded by the chain line of FIG. 1.
Figure 19:
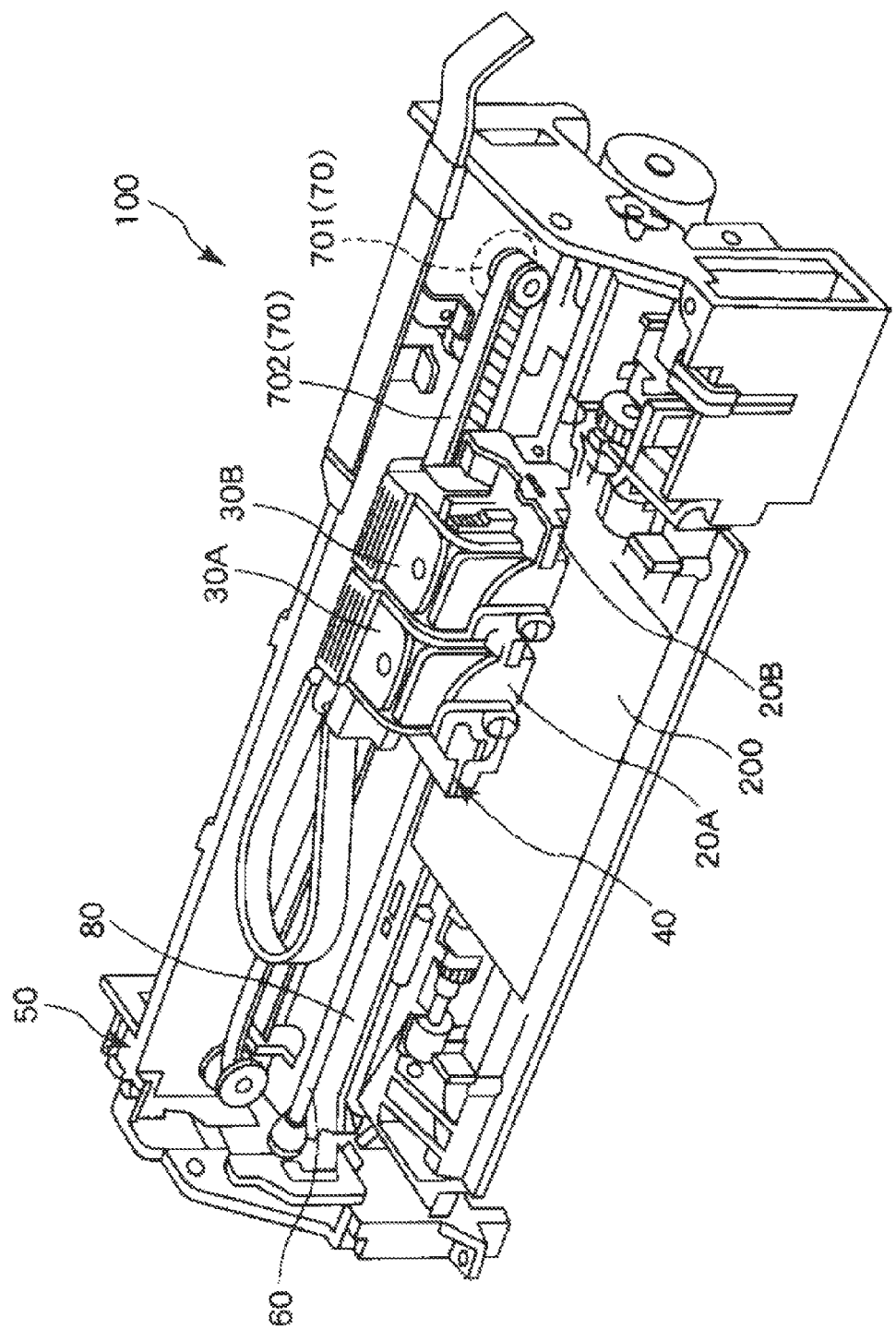
FIG. 19 is a perspective view illustrating a printing apparatus according to the embodiment of the invention.

FIG. 1 is a transverse cross-sectional view illustrating a liquid droplet ejecting head according to an embodiment of the invention. FIG. 2 is a diagram (top plan view) viewed from a direction of the arrow A of FIG. 1. FIG. 3 is an enlarged detailed diagram of a region [B] surrounded by the chain line of FIG. 2. FIG. 4 is an enlarged detailed diagram of a region [C] surrounded by the chain line of FIG. 1. FIGS. 5 to 12 are schematic transverse cross-sectional views illustrating a procedure of steps of a method (first embodiment) of manufacturing the liquid droplet ejecting head according to the embodiment of the invention. FIG. 19 is a perspective view illustrating a printing apparatus according to the embodiment of the invention. It should be noted that, hereinafter, for convenience of description, in FIGS. 1, 4 to 12, and 19 (likewise, in FIGS. 13 to 17), the upper side is referred to as "up" or "above", and the lower side is referred to as "down" or "under".

A liquid droplet ejecting head 1 shown in FIGS. 1 to 4 includes a base substrate 2, which is formed as a plate-like body, and an IC (Integrated Circuit) package 9 which is disposed on the base substrate 2. As described later, the liquid droplet ejecting head 1 is mounted in a printing apparatus (liquid droplet ejection apparatus) 100, and ejects an ink 300 as liquid droplets onto a printing medium 200 such as a printing paper, thereby performing printing on the printing medium 200 (refer to FIG. 19).

As shown in FIG. 2, the base substrate 2 is formed in a rectangular shape in plan view. The base substrate 2 has a sealing plate (first substrate) 10A, a device substrate (second substrate) 10B, and a nozzle substrate (nozzle plate) 21. The base substrate 2 is formed as a laminated body in which the nozzle substrate 21, the device substrate 10B, and the sealing plate 10A are laminated from the lower side in this order. Further, the sealing plate 10A and the device substrate 10B are bonded through an adhesive layer (adhesive) 11. The thickness of the adhesive layer 11 is not particularly limited. For example, the thickness is preferably in a range of 1 to 10 µm, and is more preferably in a range of 1 to 5 µm. Furthermore, the device substrate 10B and the nozzle substrate 21 are also bonded through an adhesive layer (not shown in the drawing).

The sealing plate 10A is also formed as a laminated body, and has a reservoir formation substrate (protective substrate) 24, and a compliance substrate 26. Those are laminated from the lower side in this order. Further, the device substrate 10B is also formed as a laminated body, and has a flow passage formation substrate 22, a vibration plate 23, and a plurality of piezoelectric elements 25. Those are laminated from the lower side in this order. Then, in each laminated body, layers constituting the laminated body are bonded through, for example, a thermal adhesion film, an adhesive layer, or the like not shown in the drawing.

Further, the sealing plate itself and the device substrate themselves are also formed as a laminated body. Layers constituting the laminated body are bonded through, for example, a thermal adhesion film, an adhesive layer, or the like not shown in the drawing.

As described above, since the base substrate 2 is formed as a laminated body, the layers constituting the laminated body can be respectively employed in accordance with use applications and functions. Thereby, it is possible to obtain the low-profile liquid droplet ejecting head 1, and this contributes to a decrease in size of the printing apparatus 100.

As shown in FIG. 1, the nozzle substrate 21 has a plurality of ejection ports (nozzle openings) 211 which are formed through the nozzle substrate 21, that is, formed to be open toward the lower surface (the other surface) 212 of the base substrate 2 (plate-like body). Such ejection ports 211 are arranged in a matrix. As shown in FIG. 2, in the embodiment, the ejection ports 211 are arranged in n rows (n is an integer not less than 1) in the length direction (long side direction) of the base substrate 2 and in two columns in the width direction (short side direction).

In addition, it is preferable that each ejection port 211 be provided with a coating layer with water repellency. Thereby, the liquid droplets, which are ejected from the ejection ports 211, drop downward as vertically as possible, and can be reliably landed at landing target positions on the printing medium 200.

Further, a constituent material of the nozzle substrate 21 is not particularly limited, and it is preferable that the material be, for example, silicon material or stainless steel. Such a material is excellent in chemical resistance. Thus, even during exposure of the ink 300 over a long period of time, the nozzle substrate 21 can be reliably prevented from changing in quality and deteriorating. Furthermore, such a material is excellent in processability, and thus it is possible to obtain the nozzle substrate 21 with high dimensional accuracy. Hence, it is possible to obtain the liquid droplet ejecting head 1 with high reliability.

Flow passages (cavities) 221, through which the ink 300 is sent to the respective ejection ports 211, are formed on the flow passage formation substrate 22. The flow passages 221 are formed by performing, for example, etching. As shown in FIG. 1, each flow passage 221 can be divided into a pressure generation chamber 222, a relay chamber (communication portion) 223, and a communication passage (supply passage) 224 through which the pressure generation chamber 222 communicates with the relay chamber 223.

The pressure generation chamber 222 is provided to correspond to each ejection port 211, and communicates with the outside through the ejection port 211.

The relay chamber 223 is provided upstream of the pressure generation chamber 222.

The communication passage 224 is provided between the pressure generation chamber 222 and the relay chamber 223.

In addition, the constituent material of the flow passage formation substrate 22 is not particularly limited, and may employ, for example, the same constituent material as the nozzle substrate 21.

The vibration plate 23 may be vibrated in the thickness direction by driving of the piezoelectric elements 25 to be described later. Further, some parts of the vibration plate 23 face the pressure generation chambers 222. Then, by vibrating the vibration plate 23, the pressures within the pressure generation chambers 222 are changed, and the ink 300 can be ejected as liquid droplets through the ejection ports 211 from the pressure generation chambers 222.

Such a vibration plate 23 is formed by laminating an elastic film 231 and a lower electrode film 232 in order from the flow passage formation substrate 22 side. The elastic film 231 is formed of a silicon oxide film with a thickness of, for example, about 1 to 2 μm. The lower electrode film 232 is formed of a metal film with a thickness of, for example, about 0.2 μm. The lower electrode film 232 functions as a common electrode of the plurality of piezoelectric elements 25 which are disposed between the flow passage formation substrate 22 and the reservoir formation substrate 24.

In the reservoir formation substrate 24, the reservoirs 241, which temporarily store the ink 300, are formed to respectively communicate with the flow passages 221 of the flow passage formation substrate 22. As shown in FIG. 1, each reservoir 241 can be divided into a first chamber (reservoir section) 242, a second chamber (injection passage) 243, and a communication passage 244 through which the first chamber 242 communicates with the second chamber 243.

The first chambers 242 are positioned above the relay chambers 223 of the flow passages 221 of the flow passage formation substrate 22. In addition, the parts of the vibration plate 23 between the first chambers 242 and the relay chambers 223 are penetrated. Thereby, each first chamber 242 communicates with each relay chamber 223.

The second chamber 243 is provided upstream of the first chamber 242.

The communication passage 244 is provided between the first chamber 242 and the second chamber 243.

It should be noted that, in the liquid droplet ejecting head 1, the relay chamber 223 may constitute a part of the reservoir 241.

Further, a piezoelectric element housing chambers 245, which respectively house the piezoelectric elements 25, is formed on the reservoir formation substrate 24. The piezoelectric element housing chamber 245 is formed separately from the reservoir 241.

The constituent material of the reservoir formation substrate 24 is not particularly limited, and may employ, for example, silicon, glass, or the like.

Each piezoelectric element 25 is formed by laminating a piezoelectric body film (piezo element) 251 and an upper electrode film 252 in order from the lower electrode film 232 side. Then, when a voltage is applied between the upper electrode film 252 and the lower electrode film 232, the piezoelectric body film 251 is deformed by the piezoelectric effect. Due to the deformation, the vibration plate 23 is vibrated in the up and down direction. As described above, due to the vibration of the vibration plate 23, the pressure within the pressure generation chamber 222 is changed, whereby the ink 300 can be ejected as liquid droplets through the ejection port 211 from the pressure generation chamber 222. As described above, each piezoelectric element 25 is configured to eject the ink 300 (liquid droplets) from the ejection port 211 through the vibration plate 23.

The compliance substrate 26 is formed by laminating a sealing film 261 and a fixing plate 262 in order from the reservoir formation substrate 24 side. The sealing film 261 is formed of a material (for example, a polyphenylene sulfide film with a thickness of about 6 μm) with flexibility. Some parts of the sealing film 261 face the reservoirs 241. Further, the fixing plate 262 is formed of a relatively hard material (for example, stainless steel with a thickness of about 30 μm) such as a metal material. It is preferable that absent portions 263 as vacant parts be formed on the parts of the fixing plate 262 facing the reservoir 241 side.

Further, injection ports 264, which penetrate through the sealing film 261 and the fixing plate 262, are formed on the compliance substrate 26. Each injection port 264 communicates with each reservoir 241 so as to inject the ink 300 into the reservoir 241.

As shown in FIG. 1, a concave portion 27 is formed on the base substrate 2 formed as the above-mentioned laminated body. The concave portion 27 is open toward the central portion of the upper surface (one surface) 265 of the sealing plate 10A (compliance substrate 26). The concave portion 27 is formed to penetrate the sealing plate 10A in the thickness direction through, for example, etching.

Further, as shown in FIGS. 1 and 2, the concave portion 27 is formed in a shape of a channel along the length direction of the base substrate 2. Then, the concave portion 27 is formed of a bottom portion 271, first side wall portions (side wall portions) 272a and 272b, and second side wall portions 273a and 273b. The first side wall portions 272a and 272b stand on the bottom portion 271, and are opposed to each other in a width direction of (a direction of intersecting with) the concave portion 27 (channel). The second side wall portions 273a and 273b stand on the bottom portion 271, and are opposed to each other in the length direction of the concave portion 27. Thereby, linear portions (linear objects) 281, which constitute a wiring pattern 28 electrically connected to the IC package 9 to be described later, are distributed on both sides of the first side wall portions 272a and 272b, and multiple (plural) linear portions 281 can be arranged along the length direction of the concave portion 27 (channel) (refer to FIG. 3). Consequently, the IC package 9, which is capable of transmitting and receiving a large volume of information through the linear portions 281, can be mounted on the base substrate.

The bottom portion 271 is a planar portion.

The first side wall portions 272a and 272b are inclined to the bottom portion 271. In addition, the inclination angle is not particularly limited, but is, for example, 54.7 degrees to the plane of the bottom portion 271 when the reservoir formation substrate 24 is formed of silicon. Further, the separation distance between the first side wall portions 272a and 272b gradually increases toward the upper surface 265 side.

The second side wall portions 273a and 273b are inclined to the bottom portion 271, similarly to the first side wall portions 272a and 272b. Further, the separation distance between the second side wall portions 273a and 273b gradually increases toward the upper surface 265 side.

As described above, the first side wall portions 272a and 272b and the second side wall portions 273a and 273b are inclined. Thus, the concave portion 27 can be easily and reliably formed by, for example, etching.

As shown in FIGS. 1 and 3, the wiring pattern 28 is provided in the concave portion 27. The wiring pattern 28 is formed of multiple linear portions 281 each of which has a linear shape. Such linear portions 281 are arranged to be distributed on the first side wall portion 272a side and the first side wall portion 272b side, and are formed along a direction of inclination.

Further, the multiple linear portions 281, which are present on the first side wall portion 272a side, are separated from the multiple linear portions 281, which are present on the first side wall portion 272b side, in the width direction of the concave portion 27 (base substrate 2).

As shown in FIG. 3, the adjacent linear portions 281, which are present on the first side wall portion 272a side, are separated from each other in the length direction of the concave portion 27. That is, the linear portions 281 are arranged along the length direction of the concave portion 27 with spacings interposed therebetween. Furthermore, the spacings between the adjacent linear portions 281 gradually increase toward the bottom portion 271 side of the concave portion 27. By forming such spacings, the adjacent linear portions 281 are reliably prevented from being shorted (short-circuited) to each other, on the first side wall portion 272a side.

Likewise, the adjacent linear portions 281, which are present on the first side wall portion 272b side, are arranged along the length direction of the concave portion 27 with spacings interposed therebetween. In addition, the spacings between the adjacent linear portions 281 gradually increase toward the bottom portion 271 side of the concave portion 27. By forming such spacings, the adjacent linear portions 281 are reliably prevented from being shorted to each other, on the first side wall portion 272b side.

As shown in FIGS. 1 and 3, each linear portion 281 is formed in a single line shape which is continuous from the upper surface 265 of the base substrate 2 to the bottom portion 271 of the concave portion 27. In addition, each linear portion 281 can be divided into an upper portion (first part) 282 which is formed on the upper surface 265, an intermediate portion (second part) 283 which is formed on the first side wall portion 272a (or first side wall portion 272b), and a lower portion (third part) 284 which is formed on the bottom portion 271. Furthermore, the lower portion 284 is connected to the upper electrode film 252.

As shown in FIG. 4, each linear portion 281 (wiring pattern 28) is formed by laminating a plurality of layers (a first layer 285 and a second layer 286 in the configuration shown in the drawing). Each of the first layer 285 and the second layer 286 is formed of a conductive material. For example, the first layer 285 is formed of Ni—Cr, and the second layer 286 is formed of Au. Such a constituent material is a metal material with a relatively small electric resistance, and is preferred as the constituent material of the wiring pattern 28. Further, the linear portion 281 is formed of two layers, and each layer can be employed in accordance with use applications and functions.

In addition, in the embodiment, each linear portion 281 is formed of two layers, but is not limited to this. For example, each linear portion 281 may be formed of three or more layers. In this case, as the constituent material of each layer, it is also possible to employ a conductive material such as Ni, Pd, Au, Ti, Ti—W, or Cu.

As shown in FIG. 1, the IC package 9 has an electronic circuit (semiconductor element) 91, a casing (package) 92 that houses the electronic circuit 91, and a plurality of terminals 93 that is exposed from the casing 92 and is electrically connected to the electronic circuit 91.

The electronic circuit 91 is formed of, for example, semiconductors.

The casing 92 is formed in a chip shape, and is able to house the electronic circuit 91 therein. The constituent material of the casing 92 is not particularly limited. For example, the material includes various resin materials, various semiconductor materials, various metal materials, ceramics, or the like.

Each terminal 93 is exposed on a front side surface (lower surface) 921 between the front side surface 921 and a rear side surface (upper surface) 922 of the casing 92 (IC package 9). Here, "front side surface" is defined as, for example, a surface on which elements are formed.

Further, the number of the arranged terminals 93 is the same as the number of the linear portions 281 constituting the wiring pattern 28. In addition, each terminal 93 is able to come into contact with the upper portion 282 of the linear portion 281 corresponding to the terminal 93. Thereby, in the electronic circuit 91 (IC package 9), the wiring pattern 28 is electrically connected to the terminals 93 through the connection members 12. In addition, the constituent material of the terminal 93 is not particularly limited, and may employ a metal material with a relatively small electric resistance such as gold or copper.

Further, each connection member 12 has a function of fixing the IC package 9 onto the base substrate 2. Thereby, it is not necessary to separately provide a fixing member for fixing the IC package 9 onto the base substrate 2. Thus, the liquid droplet ejecting head 1 can be formed to have a simple structure. As a result, the liquid droplet ejecting head 1 is made to have a small size.

The IC package 9 having such a configuration is electrically connected to the piezoelectric elements 25 through the wiring pattern 28. In addition, the IC package 9 controls an operation of each piezoelectric element 25. Thereby, it is possible to precisely and reliably eject the ink 300.

As shown in FIGS. 1 to 3, in the liquid droplet ejecting head 1, the single IC package 9 is disposed such that the front side surface 921 is set to face the concave portion 27 from the upper surface 265 side of the base substrate 2. Further, the width of the IC package 9 is greater than the width of the concave portion 27, and the IC package 9 is arranged over the concave portion 27 in the width direction.

As described above, by disposing the IC package 9, it is possible to minimize the space for disposition of the IC package 9. Therefore, it is possible to reliably decrease the size of the liquid droplet ejecting head 1. Further, since piezoelectric elements 25 can be controlled with a single IC package 9, the configuration is further advantageous in decreasing the size of the liquid droplet ejecting head 1.

Further, the IC package 9 may have a function of reinforcing a part of the base substrate 2 which is thinned by forming the concave portion 27.

In addition, as shown in FIG. 2, the total length (the length along the length direction of the concave portion 27) of the IC package 9 is shorter than the total length of the concave portion 27. Thereby, the inside of the concave portion 27 is made to communicate with the outside. For example, it is possible to dissipate the heat of the inside of the concave portion 27. Thus, heat generated from the IC package 9 and the wiring pattern 28 is prevented from being trapped in the concave portion 27.

As shown in FIG. 1, each connection member 12 is disposed between each terminal 93 of the IC package 9 and each first part 282 of the wiring pattern 28. Each connection member 12 is formed as a protrusion (bump) made of a metal such as Au, Cu, or Ni. The connection member 12 and, for example, an Anisotropic Conductive Film (ACF) or an Anisotropic Conductive Paste (ACP), which is not shown, are interposed therebetween, and are pressed. In such a manner, the connection member 12 is reliably electrically connected. Further, otherwise, a Non-Conductive Paste (NCP) can be used. In this case, the connection member 12 is directly electrically connected to the first part 282. Thereby, the terminals 93 and the first parts 282 are reliably electrically connected through the connection members 12.

Next, a method of manufacturing the liquid droplet ejecting head 1 (a method of manufacturing the liquid droplet ejecting head) will be described with reference to FIGS. 5 to 12. It should be noted that FIGS. 5 to 12 are schematic diagrams illustrating a principal section of the liquid droplet ejecting head 1.

Figure 11:
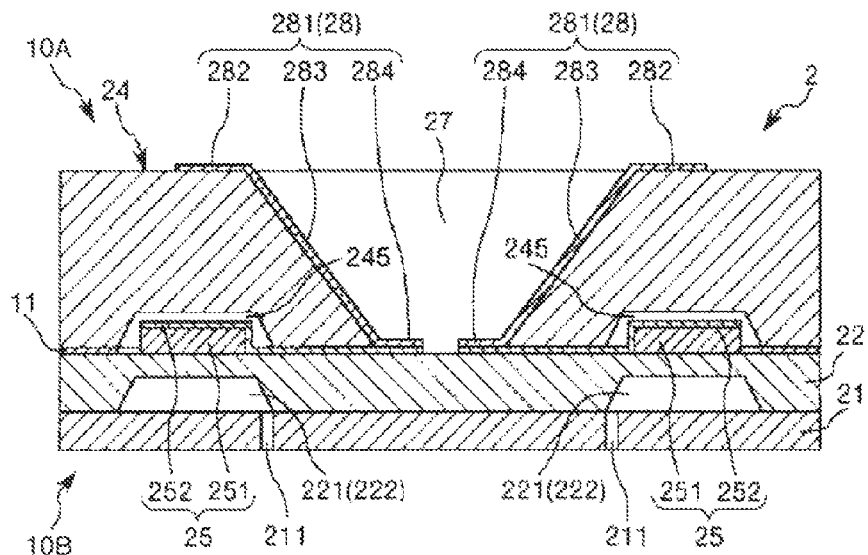
FIG. 11 is a schematic transverse cross-sectional view illustrating a procedure of a step of the method (first embodiment) of manufacturing the liquid droplet ejecting head according to the embodiment of the invention.
Figure 12:
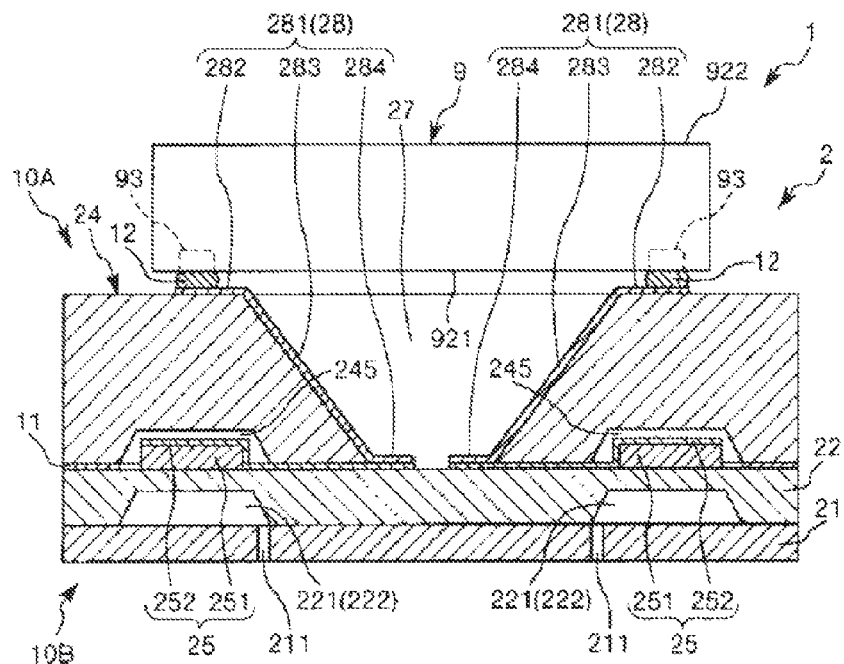
FIG. 12 is a schematic transverse cross-sectional view illustrating a procedure of a step of the method (first embodiment) of manufacturing the liquid droplet ejecting head according to the embodiment of the invention.

The manufacturing method includes a first preparation step (refer to FIG. 5), a first etching step (refer to FIG. 6), a second preparation step (refer to FIG. 7), a first bonding step (refer to FIG. 8), a wiring pattern forming step (refer to FIG. 9), a second etching step (refer to FIG. 10), a second bonding step (refer to FIG. 11), and a mounting step (refer to FIG. 12).

1. First Preparation Step

Figure 5:
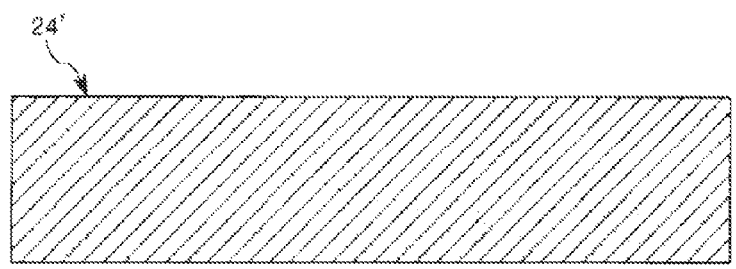
FIG. 5 is a schematic transverse cross-sectional view illustrating a procedure of a step of a method (first embodiment) of manufacturing the liquid droplet ejecting head according to the embodiment of the invention.

As shown in FIG. 5, a plate-like base material 24' to form a reservoir formation substrate 24 is provided. It should be noted that, in the embodiment, the base material 24' is a plate member which is formed of silicon and of which the thickness is 400 μm.

2. First Etching Step

Figure 6:
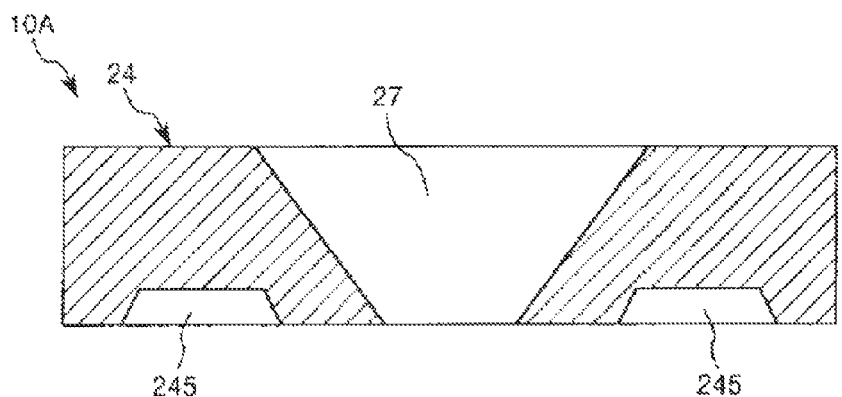
FIG. 6 is a schematic transverse cross-sectional view illustrating a procedure of a step of the method (first embodiment) of manufacturing the liquid droplet ejecting head according to the embodiment of the invention.

Next, as shown in FIG. 6, anisotropic wet etching is performed on the base material 24', and the concave portion 27, the piezoelectric element housing chamber 245, and the like are formed, thereby forming the reservoir formation substrate 24. It should be noted that, although omitted in FIG. 6 (the same in FIGS. 7 to 12), in the process flow, the reservoir 241 is also formed.

When the anisotropic wet etching is performed, first, the base material 24' is thermally oxidized, and a $SiO_2$ film with a thickness of, for example 700 nm, is formed on the outer surface of the base material 24'. Subsequently, both surfaces of the base material 24' are coated with a resist, and patterning is performed thereon. Then, by dipping the base material 24' into hydrofluoric acid, a part of the $SiO_2$ film is removed, and the outer surface of the base material 24' is exposed. Thereafter, the resist is exfoliated, the base material 24' is dipped into KOH solution with a concentration of 35%, and the concave portion 27, the piezoelectric element housing chamber 245, and the like are formed on the base material 24'. Thereby, it is possible to obtain the reservoir formation substrate 24. Subsequently, after the $SiO_2$ film is etched by the hydrofluoric acid, the reservoir formation substrate 24 is thermally oxidized again, thereby insulating the outer surface of the reservoir formation substrate 24.

3. Second Preparation Step

Figure 7:
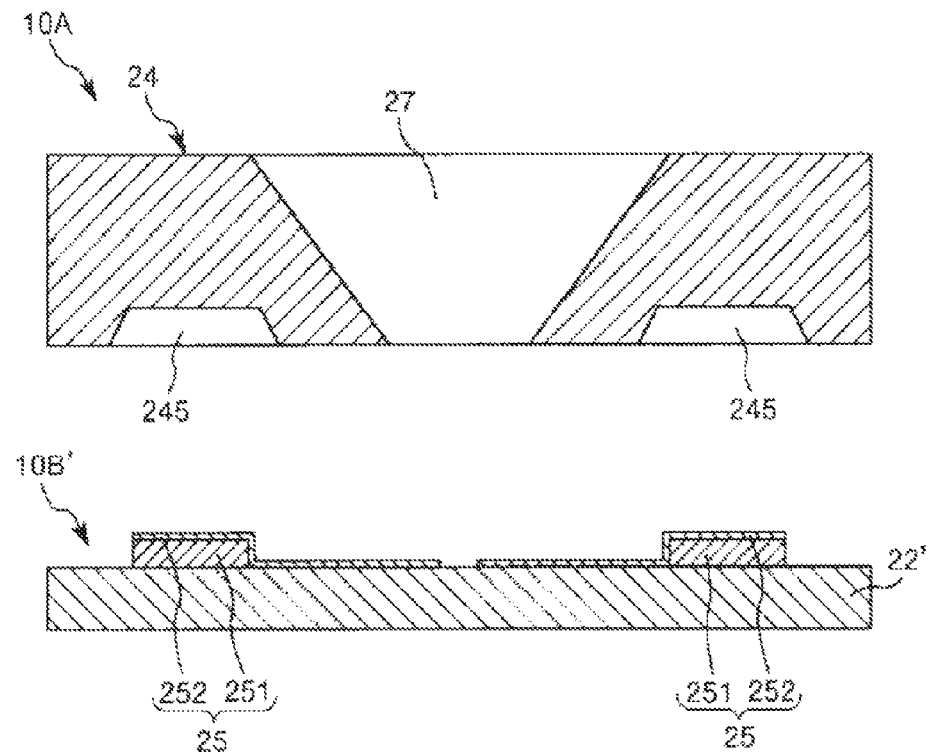
FIG. 7 is a schematic transverse cross-sectional view illustrating a procedure of a step of the method (first embodiment) of manufacturing the liquid droplet ejecting head according to the embodiment of the invention.

Next, as shown in FIG. 7, an intermediate component 10B' forming the device substrate 10B is provided. The intermediate component 10B' is a component in which the flow passage 221 is not formed on the base material 22' forming the flow passage formation substrate 22. It should be noted that, although omitted in FIG. 7 (the same in FIGS. 8 to 12), the vibration plate 23 is also disposed on the intermediate component 10B' (device substrate 10B).

4. First Bonding Step (Bonding Step)

Figure 8:
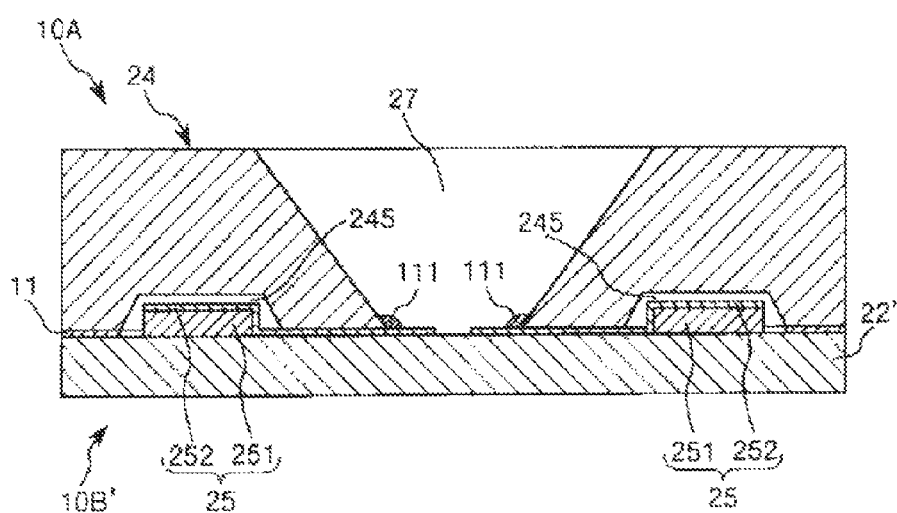
FIG. 8 is a schematic transverse cross-sectional view illustrating a procedure of a step of the method (first embodiment) of manufacturing the liquid droplet ejecting head according to the embodiment of the invention.

Next, the opposite side surface to the side on which the concave portion 27 of the reservoir formation substrate 24 is open, that is, the entire lower surface is coated with an adhesive, and as shown in FIG. 8, the reservoir formation substrate 24 (sealing plate 10A) and the intermediate component 10B' are bonded through the adhesive layer 11. In addition, it is preferable that a part 111 of the adhesive layer 11 project from the boundary portion between the reservoir formation substrate 24 and the intermediate component 10B' in the concave portion 27.

5. Wiring Pattern Forming Step

Figure 9:
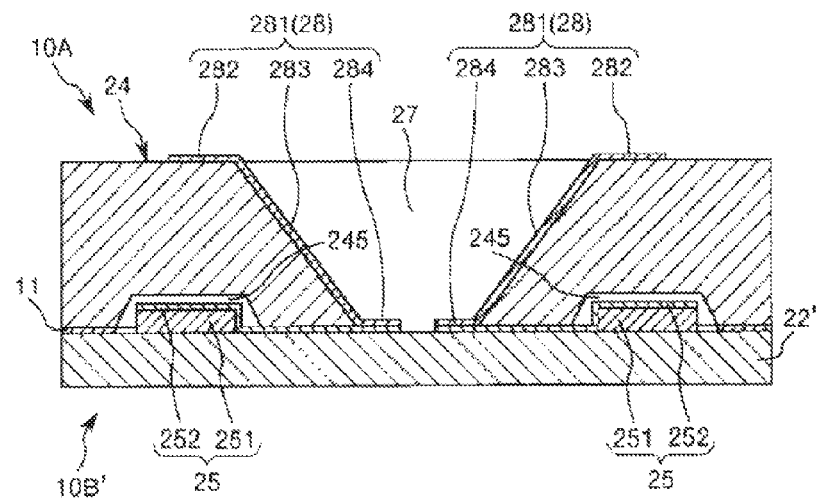
FIG. 9 is a schematic transverse cross-sectional view illustrating a procedure of a step of the method (first embodiment) of manufacturing the liquid droplet ejecting head according to the embodiment of the invention.

Next, as shown in FIG. 9, the wiring pattern 28 is formed at a position to form the wiring pattern 28. That is, the upper portion 282 is formed on the upper surface 265, the intermediate portion 283 is formed on the first side wall portion 272a (or first side wall portion 272b), and the lower portion 284 is formed on the bottom portion 271.

When the wiring pattern 28 is formed, first, a metal film is formed by sputtering on the upper side surface of the sealing plate 10A and the intermediate component 10B', that is, the entire front side surface. In addition, the metal film is a film in which the Ni—Cr layer (first layer 285) with a thickness of for example 50 nm and the Au layer (second layer 286) with a thickness of 700 nm formed on the Ni—Cr layer are laminated. Subsequently, the resist is formed on the metal film. Then, the resist is patterned by photolithography (exposure, development). Thereafter, the wet etching is sequentially performed on the Au layer and the Ni—Cr layer. As an etchant for the Au layer, an iodine-based etchant is used. As an etchant for the Ni—Cr layer, a nitric-acid-based or hydrochloric-acid-based etchant is used. Subsequently, the resist is exfoliated. Thereby, the wiring pattern 28 is formed.

6. Second Etching Step

Figure 10:
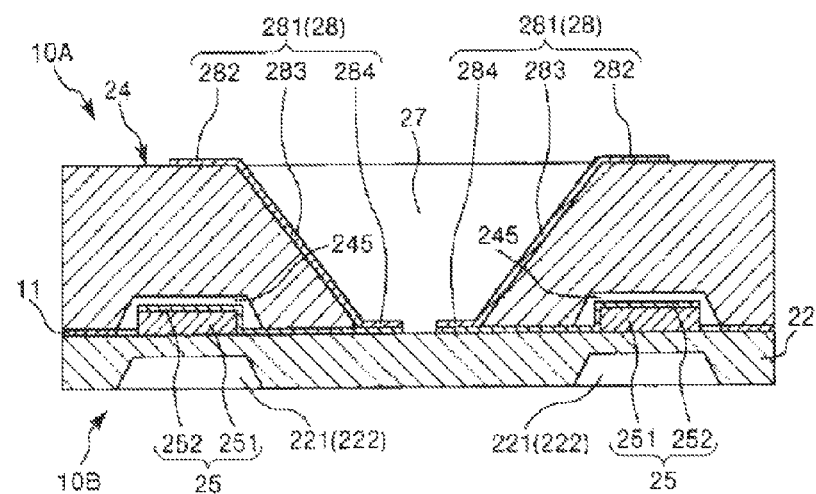
FIG. 10 is a schematic transverse cross-sectional view illustrating a procedure of a step of the method (first embodiment) of manufacturing the liquid droplet ejecting head according to the embodiment of the invention.

Next, the base material 22' of the intermediate component 10B' is etched, and as shown in FIG. 10, the flow passage 221 is formed on the base material 22'. Thereby, it is possible to obtain the device substrate 10B. It should be noted that, although omitted in FIG. 10 (the same in FIGS. 11 and 12), the relay chamber 223 and the communication passage 224 constituting the flow passage 221 are formed.

7. Second Bonding Step

Next, as shown in FIG. 11, the nozzle substrate 21 is bonded to the lower surface of the device substrate 10B through, for example, adhesion (adhesion using an adhesive or a solvent). Thereby, it is possible to obtain the base substrate 2. At the same time, the compliance substrate 26 is bonded to the reservoir formation substrate 24 through adhesion (adhesion using an adhesive or a solvent). It should be noted that, in FIG. 11 (the same in FIG. 12), the compliance substrate 26 is omitted.

8. Mounting Step

Next, as shown in FIG. 12, the IC package 9 is mounted on the base substrate 2.

When performing the mounting, first, each connection member 12 is provided for each terminal 93 of the IC package 9. In the embodiment, the connection member 12 is formed of an Au bump. Subsequently, the IC package 9, on which the connection members 12 are formed, is disposed such that the front side surface 921 faces the concave portion 27 of the base substrate 2, and each terminal 93 of the IC package 9 is electrically connected to the upper portion 282 of each linear portion 281 of the wiring pattern 28 through the connection member 12 and the ACF. It should be noted that, at the time of the connection, the connection members 12 are heated at a temperature of 170 degrees or less.

By undergoing the above-mentioned steps, it is possible to reliably obtain a small-sized liquid droplet ejecting head 1.

In addition, in the description of the manufacturing method, the single reservoir formation substrate 24 is obtained from the single base material 24', thereby manufacturing the base substrate 2. However, the invention is not limited to this, a plurality of reservoir formation substrates 24 may be obtained from the single base material 24', and a plurality of intermediate components 10B' may be bonded and be thereafter cut (divided) into each intermediate component 10B', whereby the base substrate 2 can be manufactured.

Next, the printing apparatus 100 having the liquid droplet ejecting head 1 will be described.

The printing apparatus 100 shown in FIG. 19 is a printing apparatus that performs printing on the printing medium 200 in an ink jet method. The printing apparatus 100 includes: an apparatus main body 50, printing head units 20A and 20B on which the liquid droplet ejecting head 1 is mounted; ink cartridges 30A and 30B that supply the ink 300; a carriage 40 that transports the printing head units 20A and 20B; a moving mechanism 70 that moves the carriage 40; and a carriage shaft 60 that movably supports (guides) the carriage 40.

The ink cartridge 30A is detachably mounted on the printing head unit 20A, and is able to supply the ink 300 (black ink composition) to the printing head unit 20A in the mounting state.

The ink cartridge 30B is also detachably mounted on the printing head unit 20B, and is able to supply the ink 300 (color ink composition) to the printing head unit 20B in the mounting state.

The moving mechanism 70 has a driving motor 701 and a timing belt 702 which is connected to the driving motor 701. Then, a driving force (torque) of the driving motor 701 is transferred to the carriage 40 through the timing belt 702, whereby it is possible to move the carriage 40 along the direction of the carriage shaft 60 together with the printing head units 20A and 20B.

Further, in the apparatus main body 50, a platen 80 is provided on the lower side of the carriage shaft 60 along the shaft direction. The printing medium 200, which is fed by a sheet feeding roller not shown in the drawing, is transported onto the platen 80. Then, the ink 300 is ejected onto the printing medium 200 on the platen 80, thereby performing printing.

As described above, the liquid droplet ejecting head 1 is miniaturized. Then, the printing apparatus 100 having the liquid droplet ejecting head 1 is also miniaturized.

Second Embodiment

FIGS. 13 to 15 and 17 are schematic transverse cross-sectional views illustrating a procedure of steps of the method (second embodiment) of manufacturing the liquid droplet ejecting head according to the embodiment of the invention. FIG. 16 is an enlarged detailed diagram of a region [D] surrounded by the chain line of FIG. 15.

Hereinafter, referring to the drawings, a description will be given of a liquid droplet ejecting head, a printing apparatus, and the method of manufacturing the liquid droplet ejecting head according to the second embodiment of the invention. However, the description will be given focusing on the difference with the above-mentioned embodiment, and the description of the same components will be omitted.

The present embodiment is the same as the first embodiment except that some steps of the method of manufacturing the liquid droplet ejecting head are different.

Next, the method of manufacturing the liquid droplet ejecting head 1 (the method of manufacturing the liquid droplet ejecting head) will be described with reference to FIGS. 13 to 17. It should be noted that FIGS. 13 to 17 are schematic diagrams illustrating a principal section of the liquid droplet ejecting head 1.

The manufacturing method is the same as the manufacturing method of the first embodiment in the first preparation step, the first etching step, and the second etching step to the mounting step. The manufacturing method of the present embodiment is different from that of the first embodiment in the steps between the first etching step and the second etching step. The different steps are the first wiring pattern forming step (refer to FIG. 13), the second preparation step (refer to FIG. 14), the first bonding step (refer to FIGS. 15 and 16), and the second wiring pattern forming step (refer to FIG. 17).

1. First Wiring Pattern Forming Step

Figure 13:
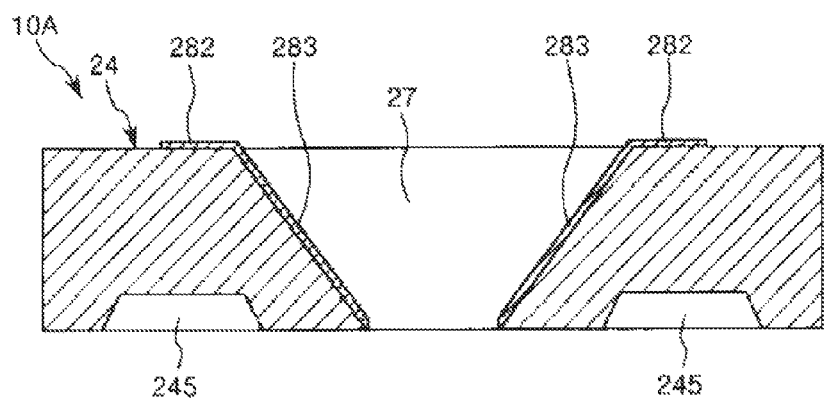
FIG. 13 is a schematic transverse cross-sectional view illustrating a procedure of a step of a method (second embodiment) of manufacturing the liquid droplet ejecting head according to the embodiment of the invention.

As shown in FIG. 13, the upper portions 282 constituting a part of the wiring pattern 28 are formed on the upper surface 265, and the intermediate portions 283 are formed on the first side wall portion 272a (or the first side wall portion 272b).

When the formation is performed, first, a metal film is formed by sputtering on the upper side surface of the sealing plate 10A, that is, the entire front side surface. In addition, the metal film is a film in which the Ni—Cr layer (first layer 285) with a thickness of for example 50 nm and the Au layer (second layer 286) with a thickness of 700 nm formed on the Ni—Cr layer are laminated. Subsequently, the resist is formed on the metal film. Then, the resist is patterned by photolithography (exposure, development). Thereafter, the wet etching is sequentially performed on the Au layer and the Ni—Cr layer. As an etchant for the Au layer, an iodine-based etchant is used. As an etchant for the Ni—Cr layer, a nitric-acid-based or hydrochloric-acid-based etchant is used. Subsequently, the resist is exfoliated. Thereby, the upper portions 282 and the intermediate portions 283 are formed.

2. Second Preparation Step

Figure 14:
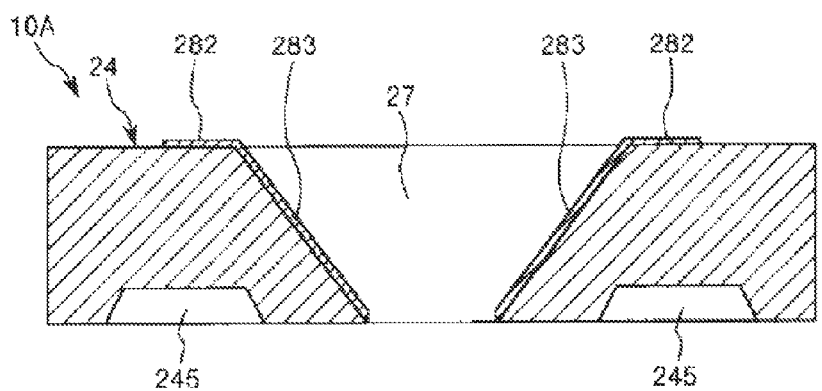
FIG. 14 is a schematic transverse cross-sectional view illustrating a procedure of a step of the method (second embodiment) of manufacturing the liquid droplet ejecting head according to the embodiment of the invention.
Figure 14:
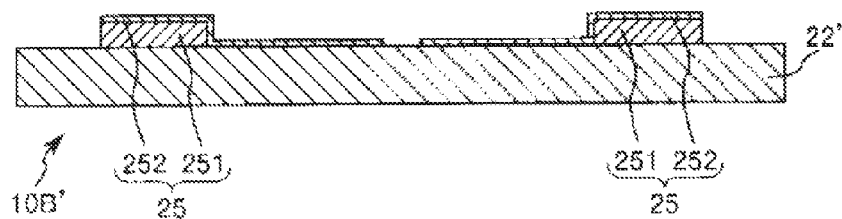

Next, as shown in FIG. 14, the intermediate component 10B' forming the device substrate 10B is provided.

3. First Bonding Step

Figure 15:
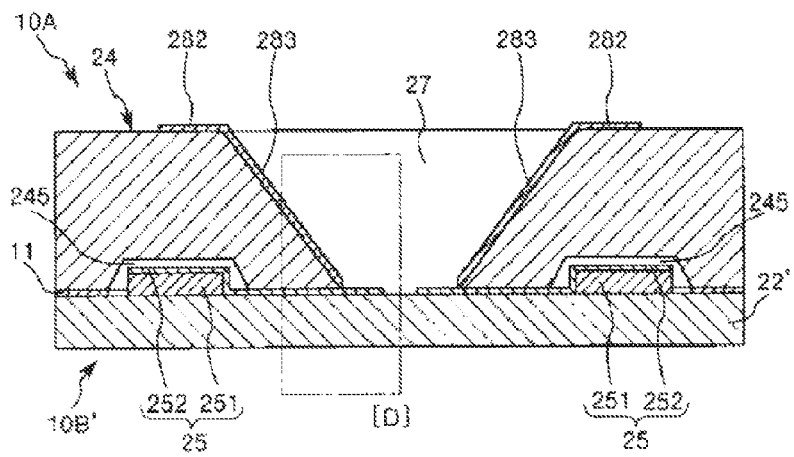
FIG. 15 is a schematic transverse cross-sectional view illustrating a procedure of a step of the method (second embodiment) of manufacturing the liquid droplet ejecting head according to the embodiment of the invention.
Figure 16:
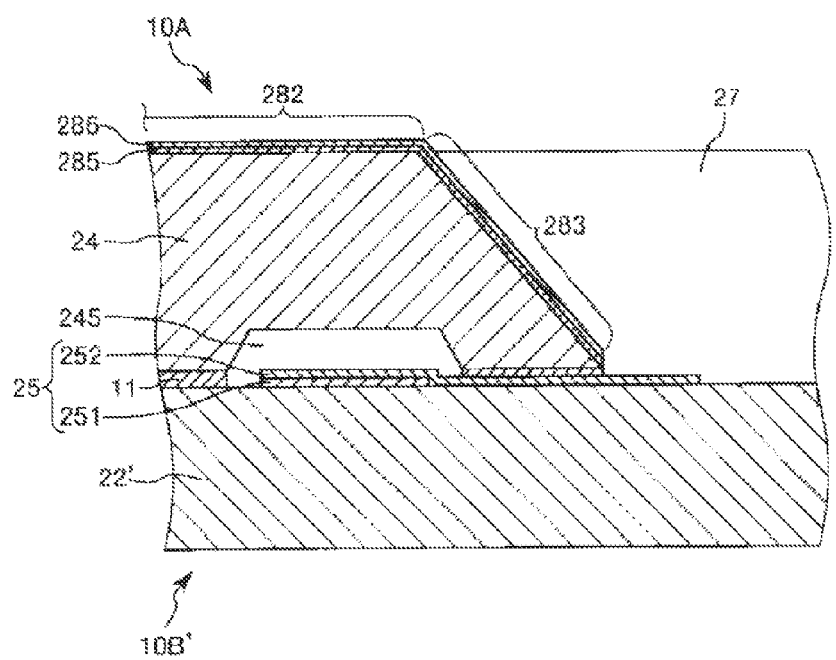
FIG. 16 is an enlarged detailed diagram of a region [D] surrounded by the chain line of FIG. 15.

Next, the opposite side surface to the side on which the concave portion 27 of the reservoir formation substrate 24 is open, that is, the entire lower surface is coated with an adhesive, and as shown in FIGS. 15 and 16, the reservoir formation substrate 24 (sealing plate 10A) and the intermediate component 10B' are bonded through the adhesive layer 11. In addition, it is preferable that a part 111 of the adhesive layer 11 do not project from the boundary portion between the reservoir formation substrate 24 and the intermediate component 10B' in the concave portion 27.

Further, in order to perform the bonding, it is necessary to position the upper electrode film 252 of each piezoelectric element 25 under each intermediate portion 283. That is, the bonding is performed to align each intermediate portion 283 and the upper electrode film 252 of each piezoelectric element 25 (refer to FIG. 16).

4. Second Wiring Pattern Forming Step

Figure 17:
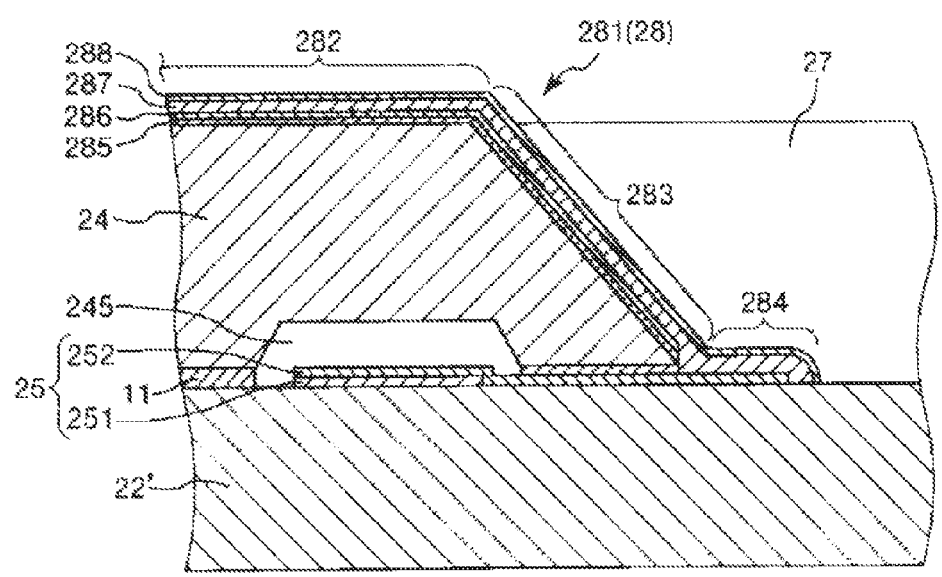
FIG. 17 is a schematic transverse cross-sectional view illustrating a procedure of a step of the method (second embodiment) of manufacturing the liquid droplet ejecting head according to the embodiment of the invention.

As shown in FIG. 17, the bonded body, in which the sealing plate 10A and the intermediate component 10B' are bonded, is dipped into an electroless plating solution, and a plated metal is deposited on the metal films (the upper portions 282, the intermediate portions 283, and the upper electrode film 252) on the bonded body. In addition, in the embodiment, the Ni plated layer 287 and the Au plated layer 288 are laminated. Thereby, the intermediate portions 283 and the upper electrode film 252 are connected through the plating. As a result, each linear portion 281 is reliably electrically connected to the upper electrode film 252 of each piezoelectric element 25.

By undergoing the above-mentioned steps, it is possible to reliably obtain a small-sized liquid droplet ejecting head 1, similarly to the first embodiment.

Third Embodiment

Figure 18:
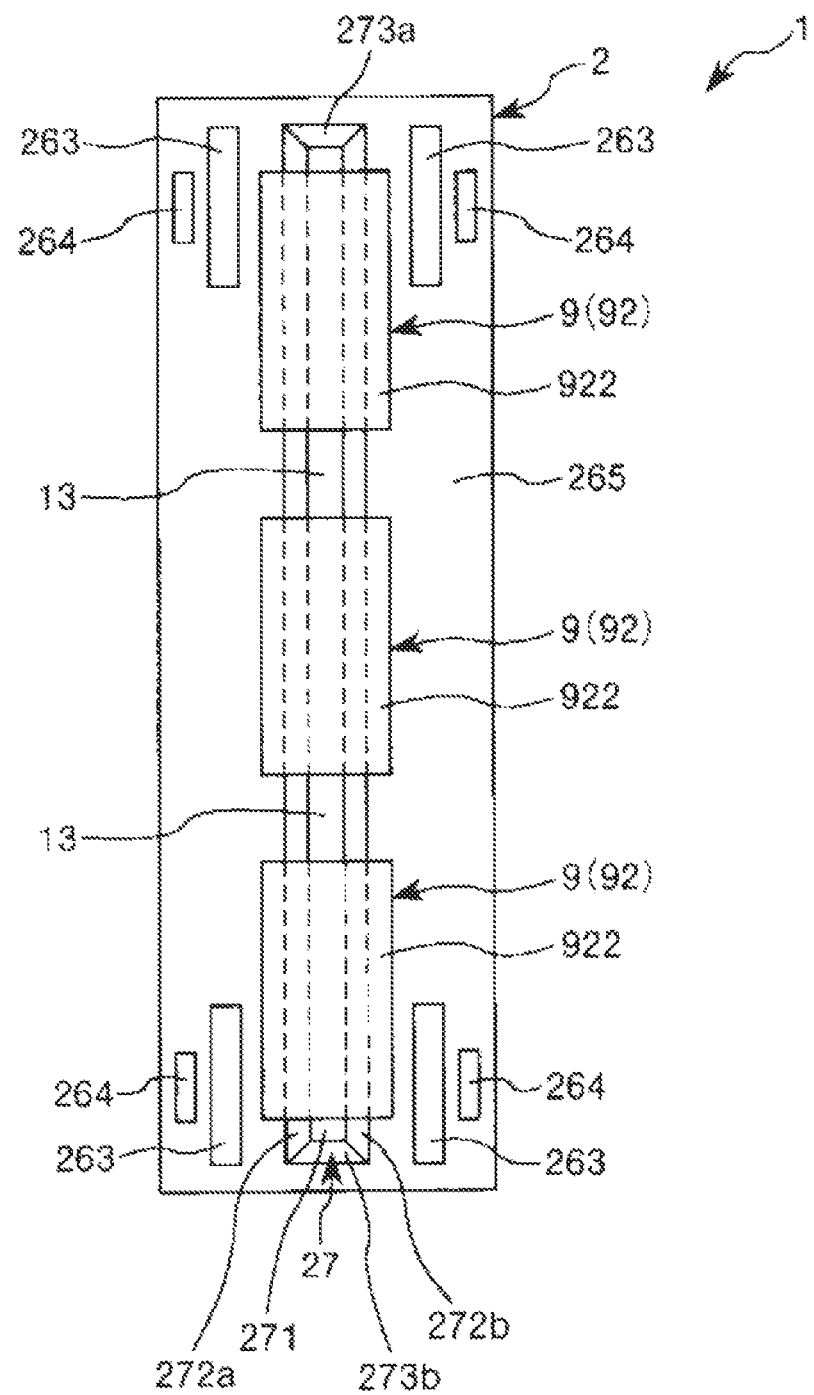
FIG. 18 is a top plan view illustrating a liquid droplet ejecting head (third embodiment) according to the embodiment of the invention.

FIG. 18 is a top plan view illustrating a liquid droplet ejecting head (third embodiment) according to the embodiment of the invention.

Hereinafter, referring to the drawing, a description will be given of a liquid droplet ejecting head, a printing apparatus, and the method of manufacturing the liquid droplet ejecting head according to the third embodiment of the invention. However, the description will be given focusing on the difference with the above-mentioned embodiment, and the description of the same components will be omitted.

The present embodiment is the same as the first embodiment except that the disposition number of the IC packages is different.

As shown in FIG. 18, in the embodiment, a plurality of (three in the configuration shown in the drawing) the IC packages 9 are disposed along the length direction of the concave portion 27 which is formed in a channel shape. Further, gaps 13 are formed between the adjacent IC packages 9. Through the gaps 13, it is possible to discharge heat within the concave portion 27.

It should be noted that the disposition number of the IC packages 9 is three in the configuration shown in the drawing. However, the invention is not limited to this. For example, the number may be two or four or more.

The above description was given of the liquid droplet ejecting head, the printing apparatus, and the method of manufacturing the liquid droplet ejecting head according to the embodiments of the invention. However, the invention is not limited to the embodiments. For example, each portion, which constitutes the liquid droplet ejecting head and the printing apparatus, can be replaced with an arbitrary component capable of exhibiting the same function. Further, an arbitrary component may be added.

Further, combination of two or more arbitrary configurations (characteristics) of embodiments of the invention may be applied to the liquid droplet ejecting head, the printing apparatus, and the method of manufacturing the liquid droplet ejecting head.

Further, in the embodiment, the liquid droplet ejecting head (printing apparatus) is configured so as to eject the ink as liquid droplets onto the printing medium such as the printing paper, thereby performing printing. The invention is not limited to this. For example, a liquid crystal display device (LCD device) may be manufactured by ejecting a material, which is for forming the liquid crystal display device, as liquid droplets. Alternatively, an organic electroluminescence display device (organic EL device) may be manufactured by ejecting a material, which is for forming the organic EL device, as liquid droplets. Alternatively, a circuit substrate may be manufactured by ejecting a material, which is for forming the wiring pattern, as liquid droplets so as to form the wiring pattern of an electronic circuit.

What is claimed is:

1. A liquid droplet ejecting head comprising:
a base substrate of a plate-like body that has a concave portion that is formed to be open toward one surface and a wiring pattern made of a conductive material; and
an IC package that is electrically connected to the wiring pattern,
wherein the concave portion has a bottom portion and two side wall portions, which stand on the bottom portion so as to be opposed to each other, and the two side wall portions are inclined such that a separation distance between the two side wall portions gradually increases toward the one surface side,
wherein the wiring pattern has a plurality of linear objects, each of which is continuous and is constituted of a first part formed on the one surface, a second part formed on the side wall portion, and a third part formed on the bottom portion, and
wherein the IC package is formed in a chip shape, has a plurality of terminals which are formed on a surface opposed to the concave portion, is mounted across the concave portion, and each terminal is electrically connected to the first part.

2. The liquid droplet ejecting head according to claim 1, wherein the linear objects are arranged to be distributed on both sides of the two side wall portions.

3. The liquid droplet ejecting head according to claim 1, wherein the concave portion is formed in a shape of a channel, and the two side wall portions are opposed to each other in a direction of intersecting with the channel.

4. The liquid droplet ejecting head according to claim 3, wherein the linear objects are disposed with spacings interposed therebetween along a direction of the channel.

5. The liquid droplet ejecting head according to claim 4, wherein the linear object spacings neighboring to one another increase from the one surface side toward the bottom portion side.

6. The liquid droplet ejecting head according to claim 3, wherein a length of the IC package in a direction of the channel is shorter than a total length of the channel.

7. The liquid droplet ejecting head according to claim 3, wherein a plurality of the IC packages is disposed with spacings interposed therebetween in a direction of the channel.

8. The liquid droplet ejecting head according to claim 1, wherein a connection member containing a conductive material is disposed between each terminal and each first part, and each terminal is electrically connected to each first part through the connection member, and wherein the connection member has a function of fixing the IC package onto the base substrate.

9. The liquid droplet ejecting head according to claim 1, wherein the base substrate has an ejection port, which is formed to be open toward the other surface of the plate-like body and ejects liquid droplets, and a piezoelectric element which causes the liquid droplets to be ejected from the ejection port, and wherein the IC package is electrically connected to the piezoelectric element through the wiring pattern so as to control an operation of the piezoelectric element.

10. The liquid droplet ejecting head according to claim 9, wherein the base substrate has a first plate-like body that has the concave portion, and a second plate-like body that is bonded to an opposite side to a side, on which the concave portion of the first plate-like body is open, and that has the piezoelectric element, and wherein the first plate-like body and the second plate-like body are bonded through an adhesive.

11. The liquid droplet ejecting head according to claim 1, wherein the wiring pattern is formed of a plurality of layers which are laminated.

12. A printing apparatus comprising the liquid droplet ejecting head according to claim 1.

13. A printing apparatus comprising the liquid droplet ejecting head according to claim 2.

14. A printing apparatus comprising the liquid droplet ejecting head according to claim 3.

15. A method of manufacturing the liquid droplet ejecting head according to claim 1,
wherein the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, and
wherein the method comprises:
bonding the first plate-like body and the second plate-like body;
forming a wiring pattern by forming the first part on the one surface, forming the second part on the side wall portion, and forming the third part on the bottom portion; and
mounting the IC package such that the front side surface of the IC package faces the concave portion and each terminal is electrically connected to each first part.

16. A method of manufacturing the liquid droplet ejecting head according to claim 2,
wherein the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, and
wherein the method comprises:
bonding the first plate-like body and the second plate-like body;
forming a wiring pattern by forming the first part on the one surface, forming the second part on the side wall portion, and forming the third part on the bottom portion; and
mounting the IC package such that the front side surface of the IC package is adjacent to the concave portion and each terminal is electrically connected to each first part.

17. A method of manufacturing the liquid droplet ejecting head according to claim 3,
wherein the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, and
wherein the method comprises:
bonding the first plate-like body and the second plate-like body;
forming a wiring pattern by forming the first part on the one surface, forming the second part on the side wall portion, and forming the third part on the bottom portion; and
mounting the IC package such that the front side surface of the IC package is adjacent to the concave portion and each terminal is electrically connected to each first part.

18. A method of manufacturing the liquid droplet ejecting head according to claim 1,
wherein the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, and
wherein the method comprises:
forming a first wiring pattern by forming the first part on the one surface and forming the second part on the side wall portion;
bonding the first plate-like body and the second plate-like body;
forming a second wiring pattern by forming the third part on the bottom portion; and
mounting the IC package such that the front side surface of the IC package is adjacent to the concave portion and each terminal is electrically connected to each first part.

19. A method of manufacturing the liquid droplet ejecting head according to claim 2,
wherein the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, and
wherein the method comprises:
forming a first wiring pattern by forming the first part on the one surface and forming the second part on the side wall portion;
bonding the first plate-like body and the second plate-like body; forming a second wiring pattern by forming the third part on the bottom portion; and
mounting the IC package such that the front side surface of the IC package is adjacent to the concave portion and each terminal is electrically connected to each first part.

20. A method of manufacturing the liquid droplet ejecting head according to claim 3,
wherein the base substrate has a first plate-like body that has the concave portion, and a second plate-like body that is bonded to an opposite side to a side, on which the concave portion of the first plate-like body is open, and that has a piezoelectric element which is electrically connected to the IC package through the wiring pattern, and
wherein the method comprises:
forming a first wiring pattern by forming the first part on the one surface and forming the second part on the side wall portion;
bonding the first plate-like body and the second plate-like body;
forming a second wiring pattern by forming the third part on the bottom portion; and
mounting the IC package such that the front side surface of the IC package faces the concave portion and each terminal is electrically connected to each first part.

* * * * *